(12) United States Patent
Barkley et al.

(10) Patent No.: US 11,042,313 B2
(45) Date of Patent: Jun. 22, 2021

(54) METHOD AND APPARATUS FOR CONFIGURING WRITE PERFORMANCE FOR ELECTRICALLY WRITABLE MEMORY DEVICES

(71) Applicant: Micron Technology, Inc., Boise, ID (US)

(72) Inventors: Gerald Barkley, Oregon, WI (US); Poorna Kale, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 108 days.

(21) Appl. No.: 16/122,510

(22) Filed: Sep. 5, 2018

(65) Prior Publication Data

US 2019/0004719 A1    Jan. 3, 2019

Related U.S. Application Data

(63) Continuation of application No. 14/921,877, filed on Oct. 23, 2015, now Pat. No. 10,082,976, which is a continuation of application No. 14/275,727, filed on May 12, 2014, now Pat. No. 9,171,619, which is a continuation of application No. 12/337,573, filed on Dec. 17, 2008, now Pat. No. 8,725,928.

(51) Int. Cl.
| | |
|---|---|
| *G06F 12/00* | (2006.01) |
| *G06F 3/06* | (2006.01) |
| *G11C 13/00* | (2006.01) |
| *G11C 16/10* | (2006.01) |
| *G11C 16/20* | (2006.01) |
| *G11C 14/00* | (2006.01) |
| *G11C 16/30* | (2006.01) |

(52) U.S. Cl.
CPC .......... *G06F 3/0629* (2013.01); *G06F 3/0604* (2013.01); *G06F 3/0679* (2013.01); *G11C 13/0069* (2013.01); *G11C 14/009* (2013.01); *G11C 16/10* (2013.01); *G11C 16/102* (2013.01); *G11C 16/20* (2013.01); *G11C 13/0004* (2013.01); *G11C 13/0038* (2013.01); *G11C 16/30* (2013.01)

(58) Field of Classification Search
None
See application file for complete search history.

(56) References Cited

U.S. PATENT DOCUMENTS

| | | |
|---|---|---|
| 7,164,601 B2 | 1/2007 | Mitani et al. |
| 7,275,164 B2 | 9/2007 | Hottelet et al. |
| 8,725,928 B1 | 5/2014 | Barkley et al. |
| 2006/0291291 A1 | 12/2006 | Hosono et al. |
| 2007/0025144 A1 | 2/2007 | Hsu et al. |

(Continued)

OTHER PUBLICATIONS

Intel® XScale™ Core Developer's Manual, Dec. 2000, (220 pages).

(Continued)

*Primary Examiner* — Daniel D Tsui

(74) *Attorney, Agent, or Firm* — Holland & Hart LLP

(57) ABSTRACT

Methods and systems are provided that may include a nonvolatile memory to store information, where the nonvolatile memory is associated with a configuration register to indicate a write speed setting for at least one write operation to the nonvolatile memory. A circuit may supply current to achieve an indicated write speed setting for the at least one write operation to the nonvolatile memory.

20 Claims, 5 Drawing Sheets

(56) References Cited

U.S. PATENT DOCUMENTS

| | | |
|---|---|---|
| 2007/0211551 A1 | 9/2007 | Yogev et al. |
| 2007/0291570 A1 | 12/2007 | Roohparvar |
| 2008/0239836 A1* | 10/2008 | Thorp .................... G11C 5/14 |
| | | 365/189.09 |
| 2014/0337563 A1 | 11/2014 | Barkley et al. |

OTHER PUBLICATIONS

Mobile Intel® Pentium® III Processor-M Datasheet, Jan. 2003 (93 pages).

Texas Instruments, MSP430x20x1, MSP430x20x2, MSP430x20x3, Mixed Signal Microcontroller, revised May 2006, pp. 1-80.

* cited by examiner

METHOD AND APPARATUS FOR CONFIGURING WRITE PERFORMANCE FOR ELECTRICALLY WRITABLE MEMORY DEVICES

CROSS REFERENCE TO RELATED APPLICATIONS

The present application for patent is a continuation of U.S. patent application Ser. No. 14/921,877 by Barkley et al., entitled "Method And Apparatus For Configuring Write Performance For Electrically Writable Memory Devices," filed Oct. 23, 2015, which is a continuation of U.S. patent application Ser. No. 14/275,727 by Barkley et al., entitled "method and apparatus for configuring write performance for electrically writable memory devices," filed May 12, 2014, which is a continuation of U.S. application Ser. No. 12/337,573 by Barkley et al., entitled "Method And Apparatus For Configuring Write Performance For Electrically Writable Memory Devices," filed Dec. 17, 2008, assigned to the assignee hereof, and each of which is expressly incorporated by reference herein.

BACKGROUND OF THE INVENTION

Field of the Invention

The subject matter disclosed herein relates to a method and apparatus for configuring write performance for electrically writable memory devices.

SUMMARY OF THE INVENTION

Nonvolatile memory devices, such as Phase-Change Memory ("PCM"), flash memory, or Electrically Erasable Programmable Read-Only Memory ("EEPROM") are sometimes packaged within an electrical system. For example, such nonvolatile memory devices may be sold within a computer system or a digital camera, for example. Such nonvolatile memory devices are often sold with information such as executable program code or data stored on them. In order to write such program code or data onto a nonvolatile memory, a certain voltage and current are required to energize cells on the nonvolatile memory and then information transmitted over a bus coupled to the nonvolatile memory may be written onto such cells.

BRIEF DESCRIPTION OF THE DRAWINGS

Non-limiting and non-exhaustive aspects are described with reference to the following figures, wherein like reference numerals refer to like parts throughout the various figures unless otherwise specified.

DETAILED DESCRIPTION OF THE PREFERRED EMBODIMENT

Figure 1:
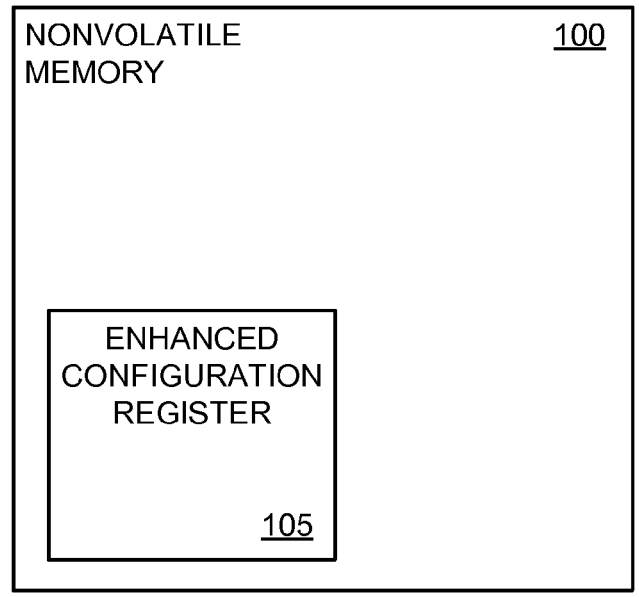
FIG. 1 is a schematic diagram of a nonvolatile memory according to one implementation.

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail so as not to obscure claimed subject matter.

Some exemplary methods and systems are described herein that may be used to allow a purchaser of a nonvolatile memory to set a speed at which information, such as data or program code, may be written onto the nonvolatile memory. A software designer may set a write speed value based on, for example, operating conditions or system capabilities of an end product, such as a computer system or digital camera, into which the nonvolatile memory is to be placed. Such a write speed setting value may indicate, for example, to change a speed or rate at which information, such as program code or data, may be written onto such a nonvolatile memory. Such a nonvolatile memory may comprise, for example, Phase-Change Memory ("PCM"), flash memory, or Electrically Erasable Programmable Read-Only Memory ("EEPROM"). A speed at which such information can be written onto a nonvolatile memory may be a function of both voltage and current used during a write operation. In some currently used systems, information may be written onto a nonvolatile memory while it is at a factory, for example. Such information written onto a nonvolatile memory while in a factory may include program code. Accordingly, a software developer may load program code onto a nonvolatile memory prior to the nonvolatile memory being placed into an end product.

In a factory environment, it may be advantageous to write such information onto a nonvolatile memory as quickly as possible so that such nonvolatile memories may be quickly placed into end products and sold to consumers. To this end, some systems have increased a speed of write operations by increasing a voltage used during such wrote operations. By supplying the voltage and or current, more cells in a nonvolatile memory can be programmed at the same time. Although some systems do increase a voltage and/or current to increase a speed of write operations while a nonvolatile memory is in a factory, after the nonvolatile memory is loaded with the appropriate code and/or data, the nonvolatile memory may be placed into an end product, such as a digital camera. There may be additional unused memory addresses in a nonvolatile memory that may be utilized to store additional program code and/or data if the nonvolatile memory is placed in an end product. In the event that, for example, such an end product is a digital camera, there may be a need to store a digital image in such a nonvolatile memory.

In some systems, the voltage and current used during a write operation for a nonvolatile memory within an end product is fixed and cannot be altered. For example, a voltage used may be, for example, about 1.8 volts in one system or about 3.0 volts in another system. An amount of current utilized may also remain constant, such as 40 milliamps. Therefore, such current systems have no means for changing a write speed based on system conditions and needs.

The speed at which information may be written to such cells of a nonvolatile memory is dependent upon a voltage and current utilized during a write operation. Current systems, however, utilize fixed voltage and current settings when writing information onto cells of a nonvolatile memory. Accordingly, a speed of such a write operation is fixed within an end product and cannot be altered based on operating conditions.

As discussed herein, according to one implementation, a method and system are provided that allow a user to set a current setting utilized during a write operation. For example, a user may increase the amount of current utilized during a write operation in order to increase a speed of the write operation. In one particular implementation, a user at a factory may configure a setting for a speed of a write operation. Based on a selected speed, an amount of current to be utilized during a write operation may be determined. In another implementation, an operator in a factory environment, for example, may set an amount of current to be utilized during a write operation—a speed of a write operation is then based on the current setting. A user may utilize a designated memory register, for example, on a nonvolatile memory to set the write speed and/or current utilized during the write operation, and such a setting may be read prior to any information being written to the nonvolatile memory. Alternatively, a user may utilize a switch, for example, on a nonvolatile memory to set the write speed and/or current utilized during the write operation.

Such a write speed setting may be based upon an amount of current expected to be available within a system. For example, if a nonvolatile memory is utilized within a digital camera, the digital camera may include a battery and several other devices that may require electrical power periodically, such as a light bulb, a display, at least one processing element such as a processor, and a nonvolatile memory, to name just a few examples. If typical power usage of such elements is known, the system may have additional power that may be utilized to provide an increased amount of current to such a nonvolatile memory during a write operation. In one implementation having a large number of electronic elements receiving power from the same battery, the amount of current that can be supplied to a nonvolatile memory may be lower that an amount of current that could be supplied in a system having a smaller number of electronic elements.

In one implementation, a system may include a power management device. Such a power management device may be adapted to determine current power consumption of the system and modify an amount of current to supply to a nonvolatile memory during a write operation accordingly. For example, in one implementation, a setting may indicate a write speed and therefore an amount of current to supply to a nonvolatile memory. In the event that there is sufficient power to provide current necessary to achieve a desired write speed, then such current may be provided to such a nonvolatile memory. If, however, there are electronic elements currently drawing enough power such that the system is unable to supply the amount of current that would be needed in order to meet the desired write speed, then an amount of current supplied may be lower and may be determined by such a power management device.

In one implementation, a setting for a nonvolatile memory may be set to either a fixed write speed or to a dynamically adjusted write speed. In a fixed write speed setting, current may be adjusted to ensure a fixed write speed to such a nonvolatile memory. In a dynamic write speed setting, an amount of current supplied for write operations to a nonvolatile memory may be set to a maximum amount given power usage at a particular time within a system. Accordingly, if several electronic components within a system are idle at a particular time, more current may be available that if they are relatively few electronic components idle within the system.

FIG. 1 illustrates a nonvolatile memory 100 according to one implementation. As discussed above, nonvolatile memory 100 may comprise a PCM, flash memory, or EEPROM, for example. Nonvolatile memory may include an enhanced configuration register 105. In one implementation, enhanced configuration register 105 may comprise a register or address in nonvolatile memory 100 that may be set, for example, if nonvolatile memory 100 is in a factory environment, prior to being placed into an electronic system, such as a motherboard of a digital camera or other end product. Enhanced configuration register 105 may comprise a write speed configuration register. Alternatively, nonvolatile memory may include a switch which may be set with a write speed setting.

In one implementation, a write speed setting may be stored as data within enhanced configuration register 105. In one implementation, a write speed setting may indicate whether a write speed is fixed or whether a write speed is dynamic. In the event that a write speed setting indicates that a write speed is fixed, write speed setting may indicate a particular speed of a write, such as a specified rate of a write operation or, for example, a fast write mode or a slow write mode.

Figure 2:
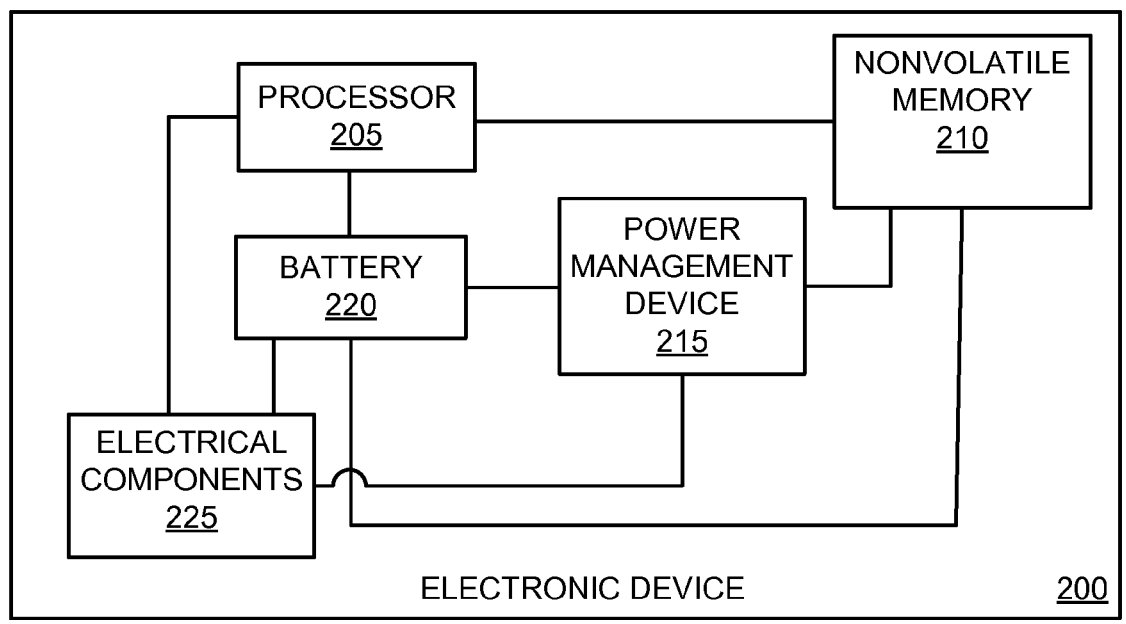
FIG. 2 is a schematic diagram of an electronic device according to one implementation.

FIG. 2 illustrates an electronic device 200 according to one implementation. As shown, electronic device 200 may include a number of components, some, or all, of which may be stored on a motherboard within electronic device 200. Electronic device 200 may include a processing element such as a processor 205, a nonvolatile memory 210, a power management device 215, a battery 220, and electrical components 225. Processor 205 may control power management device 215 to provide a certain amount of available current to nonvolatile memory 210 during a write operation. Power management device 215 may comprise a circuit or current supply circuit to supply such current. Processor 205 may perform the actual write operations into nonvolatile memory 210 with current provided from power management device 215. Electrical components 225 may include additional processors or other elements which may draw power, such as an electronic display or controller, for example. Processor 205 may determine a write speed setting for nonvolatile memory 210 and may control power management device 215 to provide the necessary current to achieve such a write speed to nonvolatile memory 210. Processor 205 may comprise a write speed processing element to determine a write speed speeding from a configuration register of a nonvolatile memory and to control performance of one or more write operations to the nonvolatile memory. Battery 220 may have a finite amount of power which may be provided to components of electronic device 200 at a particular time and power management device 215 may be adapted to optimize an amount of current provided to nonvolatile memory for one or more write operations.

It should be appreciated that a person writing software or developing the hardware may understand the cost of allowing higher write performance. A hardware designer may spec a power management chip to provide power necessary to enable higher write performance. In one implementation, a power management chip may not determine power consumption.

Figure 3:
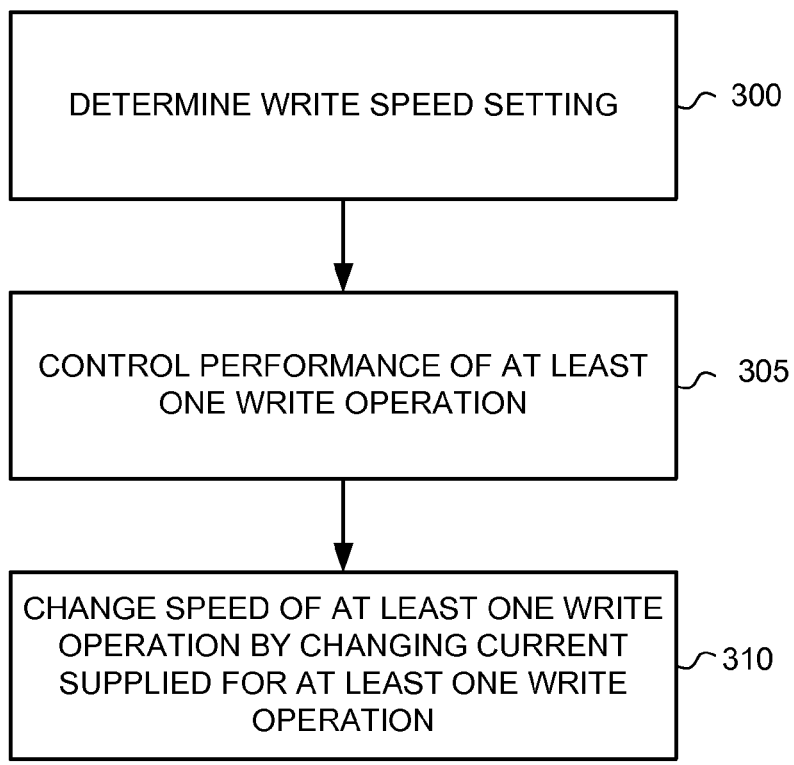
FIG. 3 is a flow diagram of a process for performing write operations to a nonvolatile memory according to one implementation.

FIG. 3 illustrates a process for performing write operations to a nonvolatile memory according to one implementation. First, at operation 300, a write speed setting is determined for a nonvolatile memory. Such a write speed setting may be stored in an enhanced configuration register, as discussed above with respect to FIG. 1. Next, performance of at least one write operation may be controlled at operation 305 in accordance with the write speed setting. Finally, at operation 310, a speed of at least one write operation may be changed by altering an amount of current supplied for at least one write operation to a nonvolatile memory.

Figure 4:
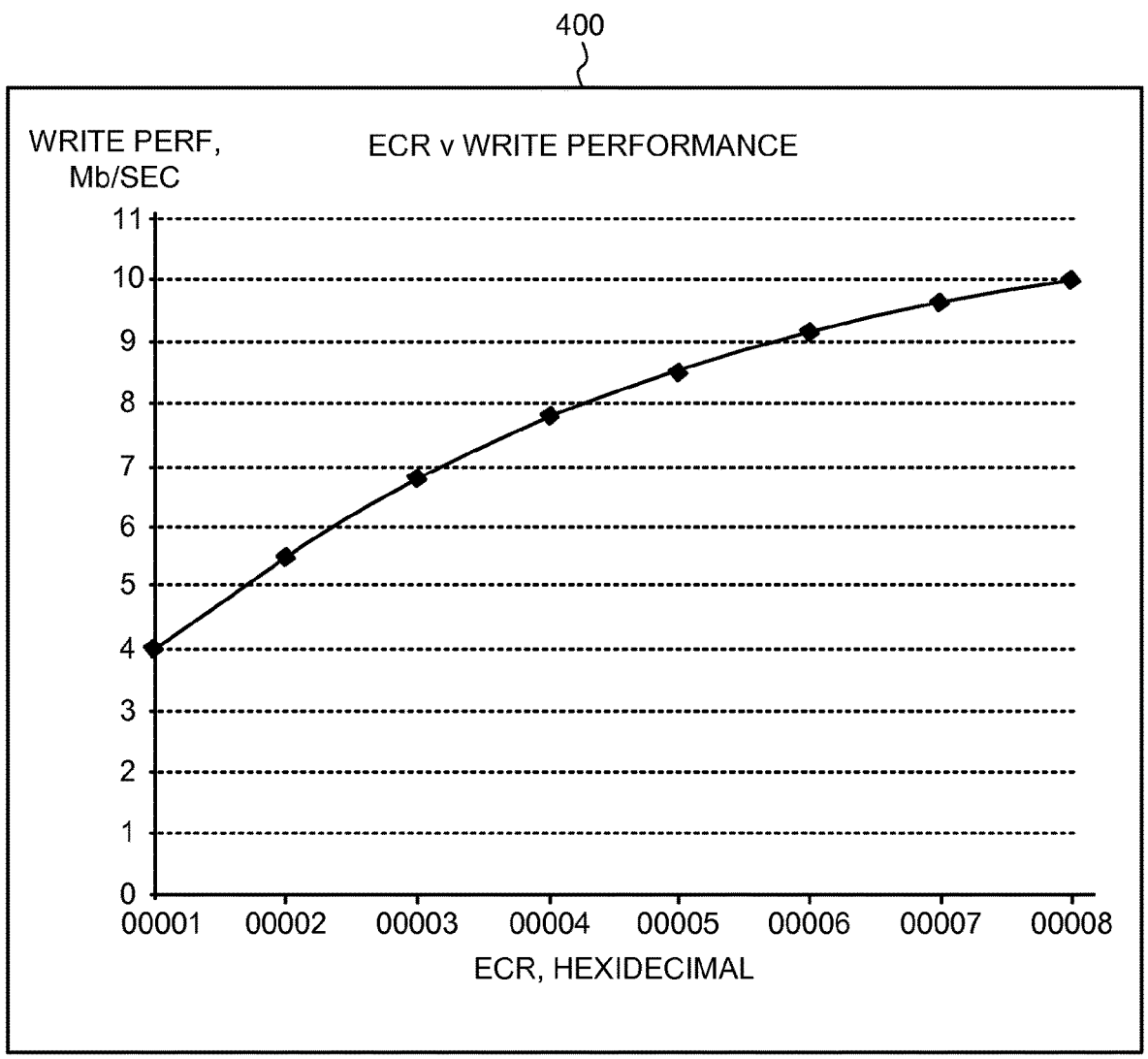
FIG. 4 is a plot showing write operation performance throughput versus different settings for an enhanced configuration register setting according to one implementation.

FIG. 4 illustrates a chart 400 illustrating write performance throughput versus different settings for an enhanced configuration register according to one implementation. Such an enhanced configuration register setting may be stored in, for example, enhanced configuration register 105 of FIG. 1. In this example, there are eight different settings for an enhanced configuration register 105, labeled as hexadecimal values between 000 and 007.

Table A below illustrates various values for enhanced configuration register 105 (listed as "ECR" in Table A) versus corresponding write throughput to a nonvolatile memory, such as nonvolatile memory 100 of FIG. 1.

TABLE A

| ECR Value | Rite Throughput |
|---|---|
| 000 | 4.0 Mb/sec |
| 001 | 5.5 Mb/sec |
| 010 | 6.8 Mb/sec |
| 011 | 7.8 Mb/sec |
| 100 | 8.5 Mb/sec |
| 101 | 9.1 Mb/sec |
| 110 | 9.7 Mb/sec |
| 111 | 10 Mb/sec |

As shown in Table A and in chart 400 of FIG. 4, if enhanced configuration register 105 is set to "000," write throughput to nonvolatile memory 100 may be about 4.0 Megabits per second (abbreviated as MB/sec). There may be a particular current that may be utilized in order to generate such a throughput and a processor 205 may determine a required current setting in order to achieve such throughput.

If, for example, enhanced configuration register 105 is set to "001," write throughput to nonvolatile memory 100 may be increased to about 5.5 Mb/sec. In order to achieve such an increased write throughput, a current supplied for such write operations may be increased accordingly. Table A and chart 400 show various other settings for enhanced configuration register 105 that may result in increasing amounts of current being provided to increase write throughput. Table A and chart 400 show an example where various increments in enhanced configuration register 105 values do not result in a linear increase in write throughout to nonvolatile memory 100. However, it should be appreciated that this is merely an example and that in some implementations, such a linear increase in throughput for various enhanced configuration register values may be achieved. Moreover, particular write throughout values shown in chart 400 and Table A are merely included to illustrate certain aspects and it should be appreciated that different write speed values may be achieved in other implementations.

Figure 5A:
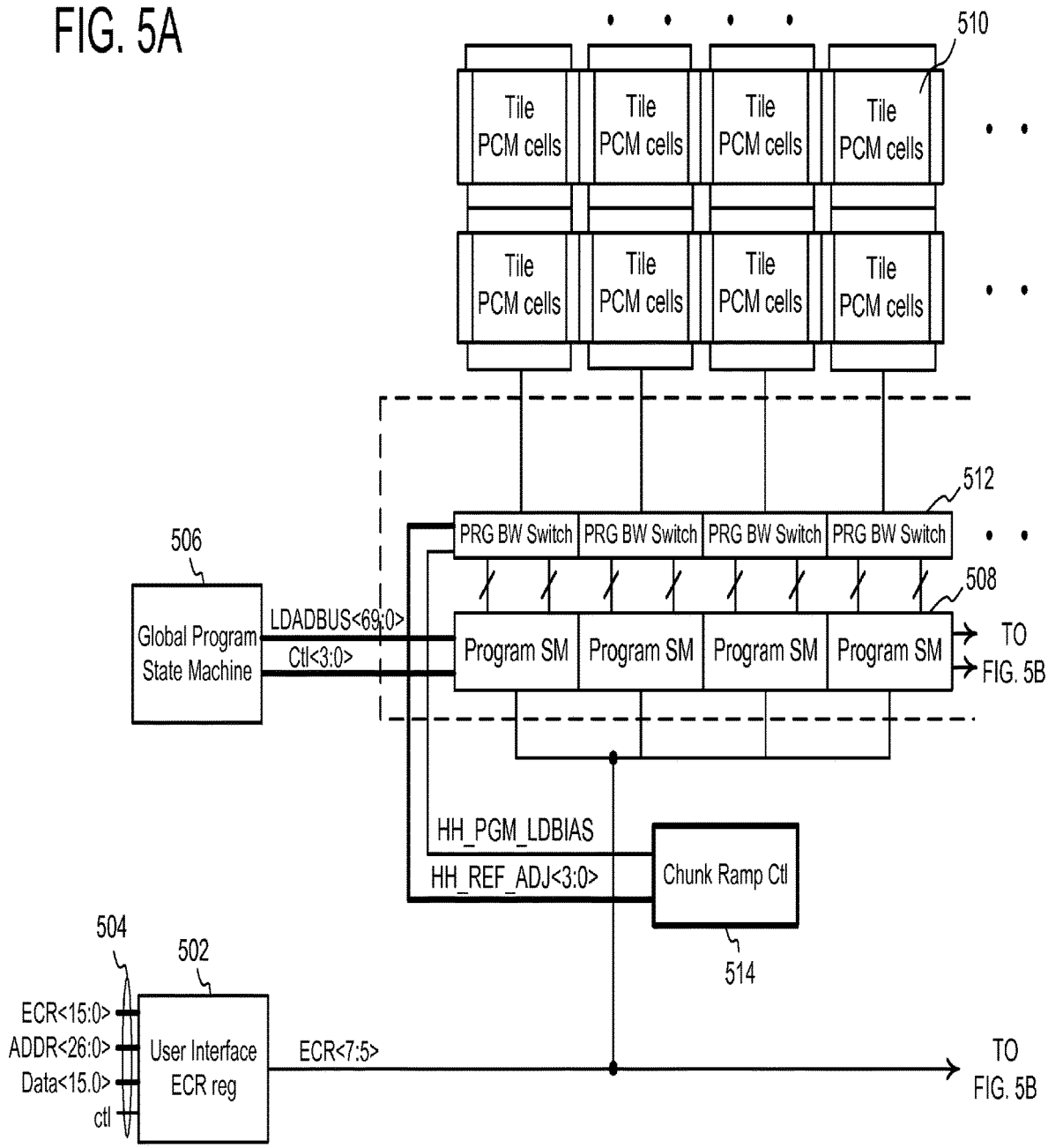
FIGS. 5A and 5B are schematic diagrams of components within a nonvolatile memory, such as a flash memory, according to one implementation.
Figure 5B:
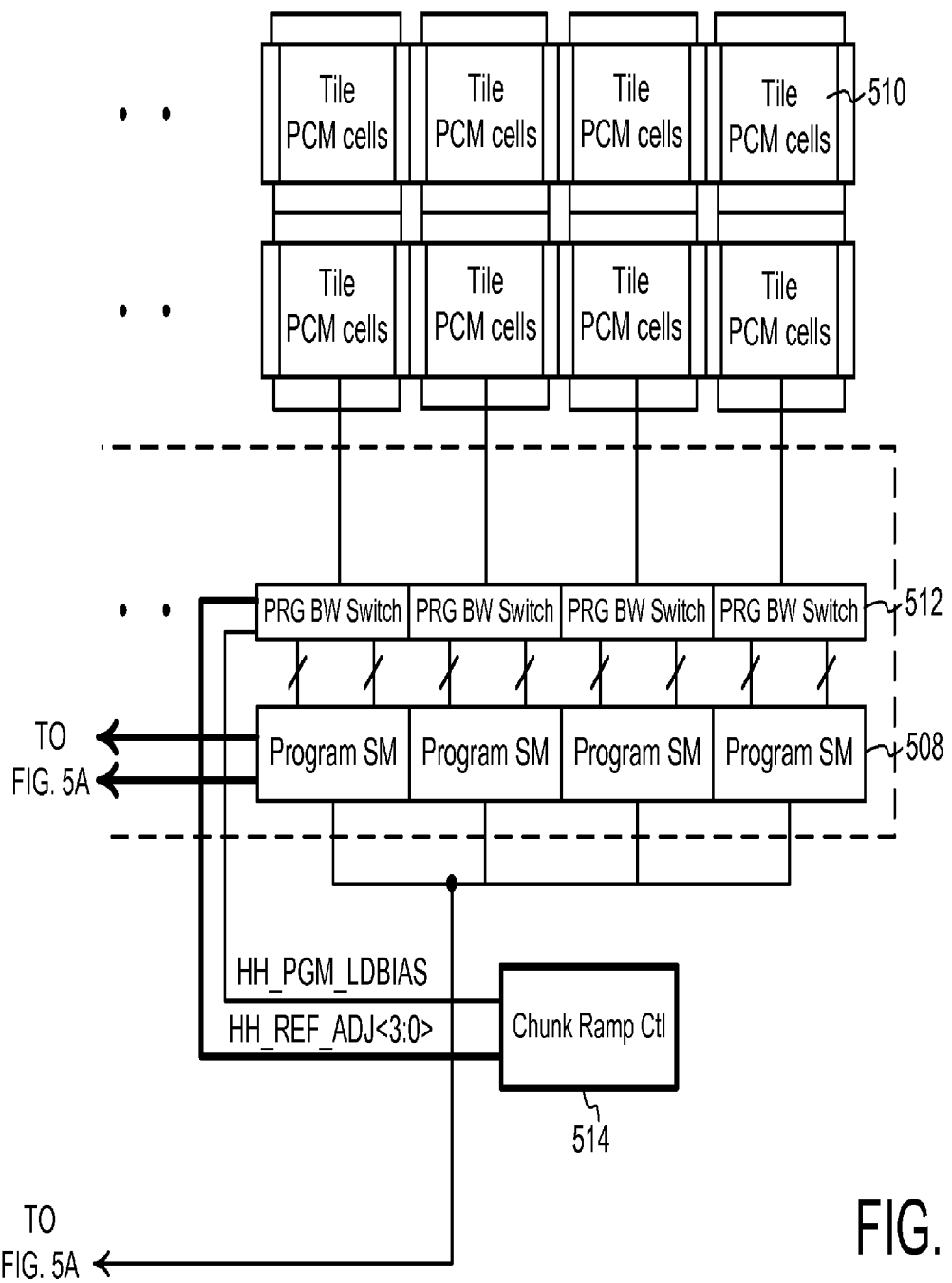

FIGS. 5A and 5B illustrate a diagram of components within a nonvolatile memory 500, such as a flash memory, according to implementation. FIG. 5A illustrates a left-hand portion of a particular circuit, and FIG. 5B illustrates a right-hand portion of the circuit. Nonvolatile memory 500 may include an enhanced configuration register (ECR) 502, which may indicate a write speed setting for writing to nonvolatile memory 500. There may be one or more input lines 504 to enhanced configuration register 502. Input lines 504 may include inputs to indicate signals which may be required for writing and reading from an enhanced configuration register (such as, e.g., control, address, and/or data).

Nonvolatile memory 500 may include a Global program state machine 506. Global program state machine 506 may contain data to be programmed and may write data to be programmed to one or more program state machines (SM) 508. Global program state machine 506 may be configured by values stored within enhanced configuration register 502. A program SM 508 may be adapted to write data to one or more memory cells 510. A memory cell 510 may comprise a tile PCM cell, for example, in an implementation where nonvolatile memory 500 is a PCM. A program SM 508 may program a particular memory cell 510 by pulsing the memory cell with electrical current and voltage to set the memory cell to either a logic value of "1" or "0." Nonvolatile memory 500 may include one or more program (PRG) bandwidth (BW) switches 512 which indicate how many bits may be written at a time. A PRG BW switch 512 may be adapted to allow a program SM 508 to write to a number of memory cells 510 in accordance with a value stored in enhanced configuration register 502. Each memory cell 510 may comprise one or more bits. If enhanced configuration register 502 is set to permit a higher write throughput or bandwidth, PRG BW switch 512 may allow more bits to be programmed at a time than would be allowed if enhanced configuration register 502 were to indicate a lower write throughput or bandwidth. Each program SM 508 may be adapted to write a certain number of bits to more or more memory cells 510 at substantially the same time, for example. To prevent an instantaneous ramp in current and/or voltage, a chunk ramp control (CTL) 514 may be included to dampen current and/or voltage pulses in order to avoid damaging any memory cells 510, for example.

Although only two groups of program SM 508 are shown in FIGS. 5A and 5B, it should be appreciated that additional groups of program SM 508 may be included in a nonvolatile memory 500 in some implementations.

Some exemplary methods and systems are described herein that may be used to set a rate of write operations to a nonvolatile memory. Current provided for such write operations may be increased in order to perform more write operations at a particular time. A write speed setting may be set to a fixed speed or to a dynamically adjusted speed. If a dynamically adjusted speed is selected, an amount of current provided for write operations may be adjusted based upon overall available current in an electronic device such that, for example, if a number of electronic components are idle at a particular time, additional current may be provided for performing one or more write operations. By allowing a current setting to be selected in a manner as discussed herein, an efficient system may be achieved that may allow information such as data to be written to a nonvolatile memory quickly, based on available system resources.

Some portions of the detailed description discussed herein are presented in terms of algorithms and/or symbolic representations of operations on data bits or binary digital signals stored within a computing system memory, such as a computer memory. These algorithmic descriptions and/or representations are the techniques used by those of ordinary skill in the data processing arts to convey the substance of their work to others skilled in the art. An algorithm is here, and generally, considered to be a self-consistent sequence of operations and/or similar processing leading to a desired result. The operations and/or processing involve physical manipulations of physical quantities. Typically, although not necessarily, these quantities may take the form of electrical and/or magnetic signals capable of being stored, transferred, combined, compared and/or otherwise manipulated. It has proven convenient at times, principally for reasons of common usage, to refer to these signals as bits, data, values, elements, symbols, characters, terms, numbers, numerals and/or the like. It should be understood, however, that all of these and similar terms are to be associated with the appropriate physical quantities and are merely convenient labels. Unless specifically stated otherwise, as apparent from the following discussion, it is appreciated that throughout this specification discussions utilizing terms such as "processing", "computing", "calculating", "associating", "identifying", "determining" and/or the like refer to the actions and/or processes of a computing platform, such as a computer or a similar electronic computing device, that manipulates and/or transforms data represented as physical electronic and/or magnetic quantities within the computing platform's memories, registers, and/or other information storage, transmission, and/or display devices.

While certain exemplary techniques have been described and shown herein using various methods and systems, it should be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all implementations falling within the scope of the appended claims, and equivalents thereof.

What is claimed is:

1. A method, comprising:
    selecting, for a memory device having a plurality of memory cells, a write bandwidth for the memory device from a plurality of write bandwidths, wherein each write bandwidth of the plurality corresponds to a respective quantity of memory cells that are written concurrently;
    determining, after selecting the write bandwidth for the memory device, a current setting for performing write operations of the memory device in accordance with the selected write bandwidth; and
    performing a write operation on the plurality of memory cells using the determined current setting.

2. The method of claim 1, further comprising:
    reading a write bandwidth setting from a memory register, wherein selecting the write bandwidth is based at least in part on the write bandwidth setting.

3. The method of claim 1, wherein selecting the write bandwidth is performed before writing information associated with the write operation.

4. The method of claim 1, wherein selecting the write bandwidth is based at least in part on an operating environment of the memory device.

5. The method of claim 1, wherein selecting the write bandwidth is based at least in part on whether the memory device is being operated in an end product.

6. The method of claim 1, wherein selecting the write bandwidth comprises:
    identifying a setting of a programmable switch; and
    selecting the write bandwidth based at least in part on the setting of the programmable switch.

7. The method of claim 1, wherein selecting the write bandwidth is based at least in part on a determined power consumption of a system that includes the memory device.

8. The method of claim 1, wherein selecting the write bandwidth is based at least in part on a determined amount of current that can be supplied to the memory device.

9. The method of claim 8, further comprising:
    determining a change in an amount of current available to the memory device, wherein selecting the write bandwidth comprises adjusting the write bandwidth based at least in part on the change in the amount of current available to the memory device.

10. The method of claim 1, wherein selecting the write bandwidth is based at least in part on a number of electronic components that are idle at a particular time.

11. The method of claim 1, wherein performing the write operation comprises:
    adapting an operation of a state machine based at least in part on the current setting.

12. The method of claim 1, wherein performing the write operation comprises:
    adapting a number of memory cells being written concurrently based at least in part on the write bandwidth.

13. An apparatus, comprising:
    a memory comprising a plurality of memory cells; and
    a processor in communication with the memory and configured to:
    select a write bandwidth for the memory from a plurality of write bandwidths for the memory, wherein each write bandwidth of the plurality corresponds to a respective quantity of memory cells that are written concurrently;
    determine, after selecting the write bandwidth for the memory, a current setting for performing write operations of the memory in accordance with the selected write bandwidth; and
    perform one or more write operations on the plurality of memory cells based at least in part on the current setting for performing write operations of the memory.

14. The apparatus of claim 13, further comprising:
    a configuration register configured to indicate one of a plurality of write speed settings, wherein the processor is configured to:
    select the write bandwidth based at least in part on the one of the plurality of write speed settings indicated by the configuration register.

15. The apparatus of claim 13, wherein the processor is configured to:
    determine an amount of power provided by a battery of the apparatus; and
    select the write bandwidth based at least in part on the amount of power.

16. The apparatus of claim 13, wherein the processor is configured to:
    select the write bandwidth based at least in part on a power consumption determined by a power management device of the apparatus.

17. The apparatus of claim 16, wherein the processor is configured to control the power management device to provide a current for the one or more write operations based at least in part on the current setting for performing write operations of the memory.

18. The apparatus of claim 13, wherein the processor is configured to select the write bandwidth based at least in part on a determined power consumption of one or more electrical components of the apparatus.

19. The apparatus of claim 13, further comprising:
a switch configured to indicate a number of bits that may be written at a time, wherein the processor is configured to:
 select the write bandwidth based at least in part on the indicated number of bits that may be written at a time.

20. An apparatus, comprising:
one or more electrical components;
a memory comprising a plurality of memory cells; and
a processor in communication with the one or more electrical components and the memory, the processor configured to:
 determine a current setting from a plurality of current settings for performing write operations of the memory based at least in part on a determined power consumption of the one or more electrical components;
 determine a quantity of memory cells to be written concurrently based at least in part on the determined current setting; and
 control a power management device to provide a current for one or more write operations on the plurality of memory cells based at least in part on the determined quantity of memory cells to be written concurrently.

\* \* \* \* \*